(12) United States Patent
Mizuno et al.

(10) Patent No.: US 6,266,110 B1
(45) Date of Patent: Jul. 24, 2001

(54) SEMICONDUCTOR DEVICE REEVENTING LIGHT FROM ENTERING ITS SUBSTRATE TRANSISTOR AND THE SAME FOR DRIVING REFLECTION TYPE LIQUID CRYSTAL

(75) Inventors: Makoto Mizuno; Masanori Iwahashi; Toshihiro Shimizu; Masaaki Fujishima, all of Utsunomiya; Koji Hanihara, Isawa-cho; Itaru Tsuchiya, Shikishima-cho; Yasuo Yagi, Kawasaki, all of (JP)

(73) Assignees: Kawasaki Steel Corporation, Kobe; Pioneer Electronic Corporation, Tokyo; Pioneer Video Corporation, Yamanashi, all of (JP)

( * ) Notice: Subject to any disclaimer, the term of this patent is extended or adjusted under 35 U.S.C. 154(b) by 0 days.

(21) Appl. No.: 08/901,696

(22) Filed: Jul. 28, 1997

(30) Foreign Application Priority Data

Jul. 30, 1996 (JP) ........................................ 8-199987
Aug. 20, 1996 (JP) ........................................ 8-218233
Oct. 1, 1996 (JP) ........................................ 8-260431

(51) Int. Cl.[7] ........................ G02F 1/1345; H01L 23/48
(52) U.S. Cl. ........................ 349/111; 349/147; 257/763; 257/770
(58) Field of Search ........................ 349/42, 43, 111, 349/113, 139, 147; 257/774; 275/770, 763, 764

(56) References Cited

U.S. PATENT DOCUMENTS

| | | | |
|---|---|---|---|
| 4,643,530 | * 2/1987 | Yamazaki | 349/43 |
| 5,293,503 | * 3/1994 | Nishigoori | 174/250 |
| 5,366,929 | * 11/1994 | Cleeves et al. | 438/644 |
| 5,644,370 | * 7/1997 | Miyawaki et al. | 349/43 |
| 5,646,449 | * 7/1997 | Nakamura et al. | 257/761 |
| 5,652,465 | * 7/1997 | Hosoda et al. | 257/758 |
| 5,686,761 | * 11/1997 | Huang et al. | 257/753 |
| 5,726,497 | * 3/1998 | Chao et al. | 257/758 |
| 5,757,450 | * 5/1998 | Fujii et al. | 349/106 |
| 5,759,876 | * 6/1998 | Singlevich et al. | 438/131 |
| 5,763,936 | * 6/1998 | Yamaha et al. | 257/644 |
| 5,851,912 | * 12/1998 | Liaw et al. | 438/621 |
| 5,880,512 | * 3/1999 | Gordon | 257/530 |
| 5,883,433 | * 3/1999 | Oda | 257/750 |
| 5,920,122 | * 7/1999 | Matsumoto et al. | 257/764 |
| 5,973,402 | * 10/1999 | Shinriki et al. | 257/768 |
| 5,978,056 | * 11/1999 | Shintani | 349/137 |
| 6,031,290 | * 4/2000 | Miyazaki et al. | 257/764 |
| 6,051,883 | * 4/2000 | Nakamura | 257/768 |

* cited by examiner

Primary Examiner—Kenneth Parker
(74) Attorney, Agent, or Firm—Oliff & Berridge, PLC

(57) ABSTRACT

An uppermost metal wiring layer is formed of titan Ti and titan nitride TiN formed thereon, on which tungsten W for filling a via hole can be deposited. The via hole is filled with W. The surface of a metal wiring layer below the uppermost metal wiring layer is covered with a low reflectivity film made of titan nitride. Thus, light incident on the surface of the semiconductor chip is prevented from reaching a substrate transistor within a semiconductor device and malfunctioning of the semiconductor device is prevented.

4 Claims, 15 Drawing Sheets

SEMICONDUCTOR DEVICE REEVENTING LIGHT FROM ENTERING ITS SUBSTRATE TRANSISTOR AND THE SAME FOR DRIVING REFLECTION TYPE LIQUID CRYSTAL

BACKGROUND OF THE INVENTION

1. Field of the Invention

The present invention relates to a semiconductor device having at least two metal layers and having metals provided not only in wiring regions but regions other than the wiring regions, and to a reflection type liquid crystal display. Particularly, the present invention relates to a semiconductor device suitable for use in a semiconductor chip for driving a reflection type liquid crystal arranged on the semiconductor chip, such as a silicon (Si) chip based liquid crystal, having a surface on which light is incident and capable of preventing the incident light from reaching a substrate transistor within the device and from causing the device to malfunction, and to a semiconductor device for driving reflection type liquid crystal using the semiconductor device.

2. Description of the Related Art

If light is incident on a transistor, current flows due to, for example, recombination. Such unexpected current causes malfunction of a semiconductor device. To solve this, a semiconductor device is usually incorporated within a light shielding package. However, there exists a semiconductor chip wherein light is incident on a chip surface such as a semiconductor device for driving a reflection type liquid crystal.

In such a semiconductor chip, conventionally, metals are provided not only in wiring regions but also in regions other than wiring regions to shield light as shown in FIG. 17. In FIG. 17, reference numeral 10 denotes a semiconductor substrate made of, for example, silicon (Si), reference numeral 12 denotes a diffused layer region for a source and drain formed in a well in the semiconductor substrate 10, reference numeral 14 denotes a LOCOS (Local Oxidation of Silicon) for electrically separating elements, reference numeral 16 denotes a first interlayer insulating film formed on the semiconductor substrate 10 including the diffused layer region 12 and the LOCOS 14, reference numeral 18 denotes a polysilicon (p-Si) gate which is a conductor formed in the first interlayer insulating film 16, reference numeral 20 denotes a first metal wiring layer communicated with either the diffused layer region 12 or the polysilicon gate 18 by a contact hole 17 at necessary position, reference numeral 22 denotes a second interlayer insulating film formed on the first metal wiring layer 20, reference numeral 24 denotes a second metal wiring layer formed on the second interlayer insulating film 22, reference numeral 26 denotes a third interlayer insulating film formed on the second metal wiring layer, reference numeral 28 denotes a third metal wiring layer formed on the third interlayer insulating film 26 and communicated with the second metal wiring layer 24 through a via hole 30 and reference numeral 32 denotes a space within the third metal wiring layer 28.

In this semiconductor chip, for purposes of preventing transmission of incident light, a metal (usually such as aluminum-silicon alloy Al—Si) is provided not only in wiring regions but in regions other than the wiring regions to form a dummy wiring which is used as a light shielding portion in the second metal wiring layer 24 and the third metal wiring layer 28.

However, the following problems occur to such a semiconductor chip as the incident light increases.

That is, if light is incident on the semiconductor chip, there is a possibility that the incident light passes two passages $I_1$ and $I_2$ shown in FIG. 17 and reaches the diffused layer region 12 of a substrate transistor.

As regards passage $I_1$, the uppermost (or third) metal wiring layer 28 in the via hole 30 is thinner than the flat portion of the layer 28 in terms of metal coverage. Due to this, the incident light transmits the via hole 30 of the uppermost metal wiring layer 28 and reaches the substrate transistor while repeating irregular reflection.

As regards passage $I_2$, the incident light transmits the space 32 where no metal is present within the uppermost metal wiring layer 28 and reaches the substrate transistor while repeating irregular reflection on the metal surface as in the case of $I_1$.

The light, which has transmitted the uppermost metal wiring layer 28 through the via hole 30 and the space 32, cannot directly reach the substrate transistor due to the presence of the light shielding portion. However, repeating reflection on the metal surface having large reflectivity, the incident light reaches indirectly the substrate transistor.

In addition, according to the conventional semiconductor device as shown in FIG. 18 where a MOS transistor is illustrated, a plurality of diffused layer regions 12 serving as a source and a drain are provided on a semiconductor substrate 10 and a first metal wiring layer 20 made of such as aluminum is provided to connect the elements through a contact hole 17 between respective diffused layer regions 12. The configuration of metal wiring layers varies with element arrangement. In FIG. 18, a lower wiring layer by a polysilicon gate 18 and the like is provided.

In such a case, as is well known, the flatness of the interlayer films with respect to the lower wiring layer depends on the wiring width or wiring spacing, especially the latter, of the polysilicon gate 18 serving as a lower wiring layer. Therefore, if various wiring spacings exist in the semiconductor chip, conditions or method of forming interlayer films disadvantageously becomes complex.

To solve this, as shown in FIG. 19, electrically independent dummy wirings 21 are provided in a wide wiring spacing. By forming the dummy wiring 21, wiring spacing can be narrowed and conditions and method of forming interlayer films can be thereby made simpler than in the case where no dummy wiring is provided.

However, the conventional method of forming normal wiring 20 and independent dummy wiring 21 has a problem that the dummy wiring 21 cannot be inserted if the spacing between the normal wirings 20 is not wider than the allowable minimum spacing between wirings for providing the dummy wiring of minimum width.

In other words, as shown in FIG. 20, if the spacing between normal wiring 20 is greater than 2S+L (where S is a minimum wiring spacing allowed by the wiring rule and L is a minimum wiring width allowed by the wiring rule), it is possible to insert a dummy wiring 21 having a width of L+α greater than L. On the other hand, if the spacing between the wiring 20 is smaller than 2S+L, the width of the dummy wiring 21 is L−α smaller than a minimum wiring width L as shown in FIG. 21. This is out of the design rule and eventually the dummy wiring 21 is eliminated and cannot be left.

As mentioned above, the flatness of an interlayer film between wiring layers depend on a wiring spacing. As shown in FIG. 22, for example, a coating film 34 by a normal SOG (Spin On Glass) is put between CVD (Chemical Vapor Deposition) oxide films 36 as an interlayer film between a polysilicon gate 18, which is a lower wiring layer, and a wiring layer 20. In such a case, there exists an optimum wiring spacing for flattening the interlayer film by burying the coating film 34 into a recessed part. However, there is a problem that if a wiring spacing into which a dummy wiring cannot be inserted, the interlayer film cannot be sufficiently flattened.

Furthermore, as the high integration of an LSI (Large Scale Integrated circuit) progresses, wiring become narrower and multiple wiring layers are increasingly formed. To realize narrow wiring and multiple wiring layers, it is necessary to maintain an enough focus depth when a resist pattern is exposed to light during the step of patterning wiring by reticle. As a result, it becomes increasingly important to sufficiently flatten layers.

As a method of realizing flat layers, a so-called CMP (Chemical Mechanical Polishing) method is widely known. The CMP method is for polishing and flattening uneven portions of an oxide film formed on a wiring.

The CMP method will now be described in more detail with reference to FIGS. 23 and 24. An interlayer insulating film 16 and a metal wiring layer 20 are formed on a semiconductor substrate 10 such as a silicon substrate by a normal method in advance. As shown in FIG. 23, during and after the formation of the metal wiring layer 20, an insulating film 22 for isolating an upper wiring layer (not shown) formed above the metal wiring layer 20 is formed. Then, the surface of the insulating film 22 is chemically and mechanically polished by the CMP method to thereby form a flat interlayer film shown in FIG. 24.

During the CMP method, if forming the insulating film 22, the lowest surface portion 22l of the insulating film 22 needs to be positioned relatively higher than the surface position 20u of the metal wiring layer 20 by approximately a film thickness necessary for insulation of the upper wiring layer (not shown). To do so, there are proposed three methods for the formation of an insulating film as follows.

A: The film is formed by using a high density plasma CVD method excellent in burying the insulating film between wirings.

B: Space between the wirings is buried by SOG.

C: The film is heavily piled by the normal CVD method until wiring layers are buried.

However, the high density plasma CVD method used in the method A is a latest state of the art at present and therefore requires a novel device. Furthermore, in the method B, buried material formed by SOG method has low film quality and low insulation. Therefore, it is necessary to provide a sandwich structure that the buried material is put between highly insulating materials. As a result, three more manufacturing steps are needed.

For these reasons, in many cases, the method C is adopted. However, in this method C, too, if a film forming method with bad coverage which cannot cover the unevenness of the substrate is used, an overhang is formed above a portion between the wirings and a void 38 is generated below the overhang as shown in FIG. 25. Due to this, if a film is polished to a thickness shown in a broken line A by the CMP method, a recessed part 22r is formed in the flat surface.

To prevent this, good coverage like a film forming method with a TEOS base P-CVD method, for example, is needed. However, the ratio (film formation ratio) of the thickness B of the insulating film 22 deposited on the wiring 20 to the thickness C of the insulating film 22 deposited between wirings is about 5:3 as shown in FIG. 26. Therefore, if a wiring spacing of as wide as approximately 2 to 5 μm exists, a difference in wiring thickness is 5000 Å and it is necessary to leave an insulating film of a thickness of 5000 Å on the wiring after the CMP method, the insulating film on the wiring is required to be as thick as approximately $$17000 \text{ Å} = (5000 \text{ Å} + 5000 \text{ Å}) \times 5 \div 3$$

and to be polished by approximately $$12000 \text{ Å} = 17000 \text{ Å} - 5000 \text{ Å}$$

by the CMP method. This adversely affects device throughput and manufacturing costs in large degree.

To prevent the above, a dummy pattern is provided between the metal wirings 20 to narrow the wiring spacing and a film from a wiring sidewall 20s is grown to bury spacing between the wiring to thereby make the necessary insulating film thinner before the CMP method is conducted. In this case, too, as shown in FIG. 26, the film formation ratio B:D at the wiring sidewall 20s is as low as approximately 5:2. Therefore, as shown in FIG. 27, a slight increase in the wiring space which occurs when, for example, parallel wirings 20 are bent, causes the insulating film prior to conducting the CMP method to be thicker. This results in lowering in throughput and an increase in manufacturing costs. In FIG. 27, the wiring spacing between straight wirings is 1.2 μm whereas that between bent wirings is widened to 1.2√2 μm.

Take the case of forming a flat insulating film having a minimum thickness of 7000 Å on the upper wiring layer having a thickness of 6000 Å by using the wiring pattern of FIG. 27, for example. An interlayer insulating film 16 and a metal wiring 20 of a thickness of 6000 Å formed on the interlayer insulating film 16 are formed on a silicon substrate (not shown) in advance using the pattern of FIG. 27 and by the ordinary method. In this case, the cross-sectional view showing the widest wiring spacing in the pattern taken along a line E—E of FIG. 27 is illustrated by FIG. 28. In this state, using the P-TEOS CVD device for forming an insulating film having good coverage, an insulating film 22 for isolating the wiring from an upper wiring is formed. In the P-TEOS CVD device, the film formation ratio of the upper portion of the wiring and the sidewall is 5:2. To bury the spacing 1.2√2 μm between wirings shown in FIG. 28, an insulating film needs to have a thickness of approximately 21000 Å as shown in FIG. 29. Since the maximum film thickness which can be provided by the P-TEOS CVD method per one step is 9000 Å, steps of forming a film of a thickness of 7000 Å are conducted three times. The configuration after the film formation is completed is illustrated by FIG. 29. In this state, the film is polished by 14000 Å by the CMP method to thereby provide a desired flat insulating film illustrated by FIG. 30.

As can be seen from the above description, in the wiring pattern of FIG. 27, a flat insulating film of FIG. 30 cannot be obtained without forming an insulating film 22 to a thickness of not less than 21000 Å by the three steps and thereafter polishing the film 16 by 14000 Å by the CMP method.

SUMMARY OF THE INVENTION

The present invention has been made to solve the above problems of prior art. It is a first object of the present invention to reduce amount of light entering the semiconductor device through the via hole of the uppermost wiring layer.

It is a second object of the present invention to prevent the light entered in the semiconductor device from reaching the substrate transistor by multiple reflection.

It is a third object of the present invention to reduce the wiring spacing of not less than S and less than L+2S into which a dummy wiring cannot be inserted according to the conventional method to thereby facilitate flattening interlayer films and increase light shielding area so as to decrease light entering in lower layer.

It is a fourth object of the present invention to form an insulating film, which should be flattened later, by minimum required thickness.

It is a fifth object of the present invention to provide a semiconductor device for driving a reflection type liquid crystal, which is integrally formed with a chip.

The first invention according to the present application attains the first object of the present invention by a semiconductor device having multiple wiring layers, comprising at least one wiring layer, wherein a dummy wiring is provided between a wiring spacing where the dummy wiring can be inserted; an uppermost wiring layer, wherein at least a bottom surface thereof is formed of a material which can deposit on an uppermost via hole, which connects the uppermost wiring layer and a lower wiring layer, and at least a top surface thereof is formed of a material on which a metal for filling the uppermost via hole can be deposited; and the uppermost via hole, wherein the metal is filled.

The uppermost wiring layer can be one layer film of Ti, TiN or TiW, or two layer film of Ti and TiN or TiW formed thereon.

The uppermost wiring layer can further comprises the other metal such as Al based alloy deposited thereon.

The uppermost via hole can be filled with tungsten W, molybdenum Mo, aluminum Al or copper Cu.

By filling the uppermost via hole with a metal such as W, the effective thickness of the metal in the via hole is increased to thereby prevent light from entering the semiconductor device through the uppermost via hole.

The first invention also attains the above-described second object by forming at least top surface of the wiring layer below the uppermost wiring layer, using a low reflectivity material.

In this case, the top surface of the wiring layer below the uppermost wiring layer can be made of TiN.

By forming at least the top surface of the wiring layer below the uppermost wiring layer using a material such as TiN having low reflectivity particularly in the visible radiation region, it is possible to prevent light from reaching the substrate transistor by multiple reflection.

The first invention also attains both first and second objects by forming at least the bottom surface of the uppermost wiring layer using a material capable of depositing a metal for filling the uppermost via hole, filling the via hole with a metal and forming at least the top surface of the wiring layer under the uppermost wiring layer using a material having low reflectivity particularly in the visible radiation region.

The second invention according to the present application attains the above-described third object by widening the wiring pattern facing the wiring spacings to narrow wiring spacing where the dummy wiring cannot be inserted therebetween.

In the second invention, a plurality of wiring patterns facing the wiring spacing can be uniformly widened.

The third invention according to the present application attains the above-described fourth object by making a wiring spacing at a bent portion of a wiring pattern on at least one wiring layer smaller than a wiring spacing at a simply bent portion.

Furthermore, the wiring spacing at the wiring bent portion is narrowed by adding an isosceles triangle-shaped portion to the corner of an outer wiring.

In addition, the wiring spacing at the bent portion is prevented from being too narrow by cutting the corner of the inner wiring.

Moreover, the wiring spacing at the bent portion of the wiring is smaller than a wiring spacing at a straight portion of the wiring.

The fourth invention according to the present application obtains the fifth object by providing a semiconductor device for driving a reflection type liquid crystal display comprising a semiconductor chip having multiple wiring layers, comprising; at least one wiring layer, wherein a dummy wiring is provided between a wiring spacing where the dummy wiring can be inserted; an uppermost wiring layer, wherein at least a bottom surface thereof is formed of a material which can deposit on an uppermost via hole, which connects the uppermost wiring layer and a lower wiring layer, and at least a top surface thereof is formed of a material on which a metal for filling the uppermost via hole can be deposited; and the uppermost via hole, wherein the metal is filled, and a reflection type liquid crystal unit arranged on the semiconductor chip and driven by the semiconductor chip.

These and other novel features and advantages of the present invention are described in or will become apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein.

DETAILED DESCRIPTION OF THE PREFERRED EMBODIMENTS

The embodiments of the present invention will hereunder be described in detail with reference to the accompanying drawings.

Figure 1:
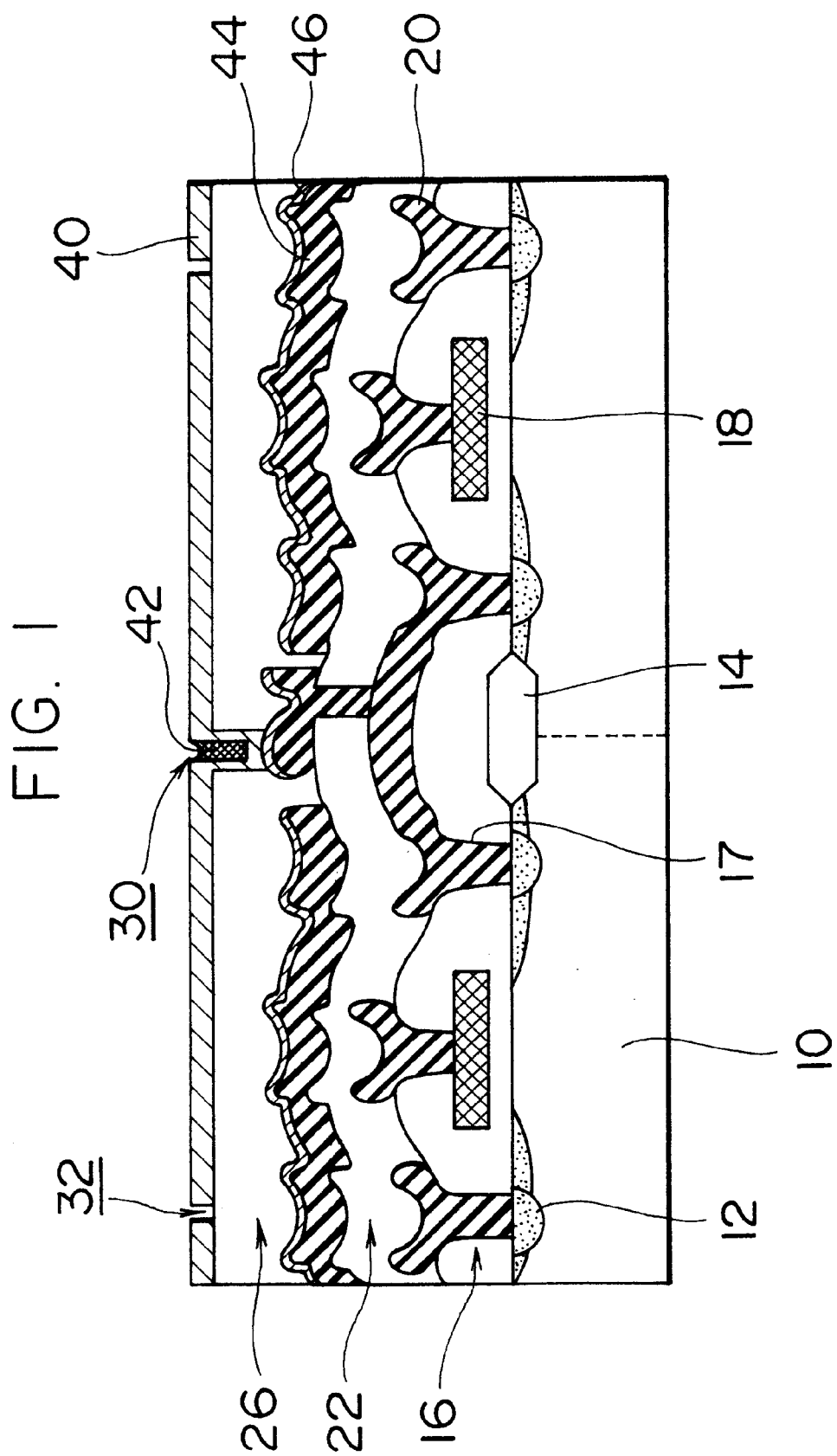
FIG. 1 is a cross-sectional view showing the structure of a semiconductor chip in the first embodiment according to the present first invention.

As shown in FIG. 1, a semiconductor chip in the first embodiment according to the present first invention comprises a semiconductor substrate 10 made of silicon Si, a diffused layer region 12, a LOCOS 14, a first interlayer insulating film 16, a contact hole 17, a polysilicon gate 18, a first metal wiring layer 20 made of, for example, Al—Si, a second interlayer insulating film 22 and a third interlayer insulating film 26 as in the case of the conventional semiconductor chip. The semiconductor chip has characteristically metals provided not only in wiring regions but also in regions other than the wiring regions. In the semiconductor chip in this embodiment, a third metal wiring layer 40 which is an uppermost wiring layer is made of TiN/Ti so that tungsten W for filling a via hole 30 can be deposited on the third metal wiring layer 40. The top surface of a second metal wiring layer 44 below the uppermost third metal wiring layer 40 is covered with a low reflectivity film 46 made of a material of low reflectivity (TiN in this embodiment).

The semiconductor chip can be manufactured by the following steps.

Figure 2:
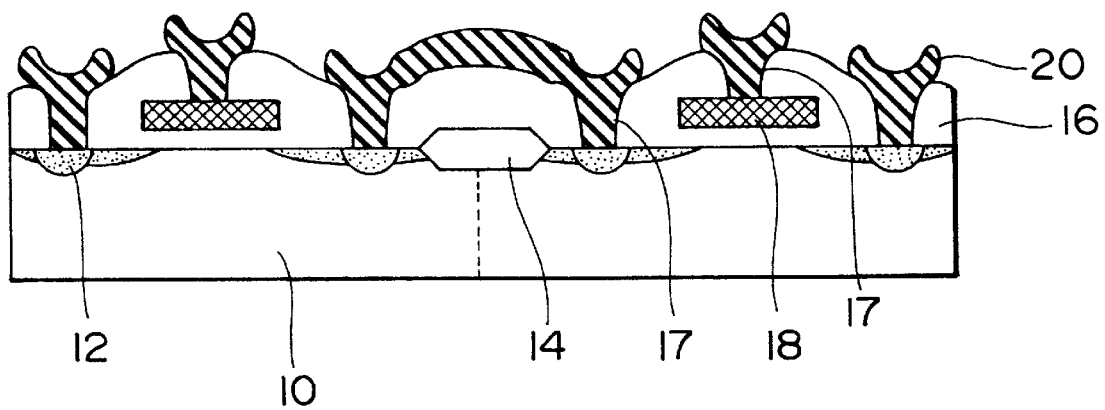
FIG. 2 is a cross-sectional view showing that a first metal wiring layer has been patterned and describing manufacturing process in the first embodiment.

As shown in FIG. 2, wells are formed in a semiconductor substrate 10 and element isolation is made by a LOCOS 14. A gate oxide film is formed by oxidation and a polysilicon film are deposited on the gate oxide film and a gate 18 is patterned. A diffused layer region 12 is formed. A first interlayer insulating film 16 is made out of a two-layer structure consisting of, for example, NSG (Non-doped Silicate Glass) and BPSG (Boron Phosphorous Silicate Glass). A contact hole 17 is formed. Al—Si (Si:1%) is deposited to a thickness of approximately 3000 to 8000 Å by the spattering method, thereby forming a first metal wiring layer 20. The first metal wiring layer 20 is then patterned.

Figure 3:
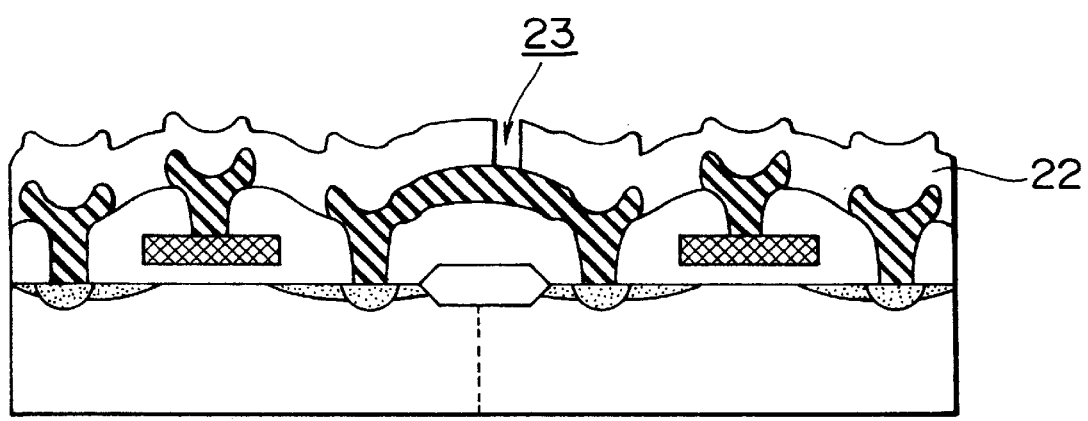
FIG. 3 is a cross-sectional view showing that a first via hole has been formed in the second interlayer insulating film during the manufacturing process in the first embodiment.

Next, as shown in FIG. 3, using TEOS ($Si(OC_2H_5)_4$) as a material, an oxide film (to be referred to as p-TEOS hereinafter), organic SOG (Spin On Glass) and a p-TEOS are deposited in this order by the plasma CVD (Chemical Vapor Deposition) method. Thus, a three-layered second interlayer insulating film 22 is formed. A first via hole 23 is then formed.

Figure 4:
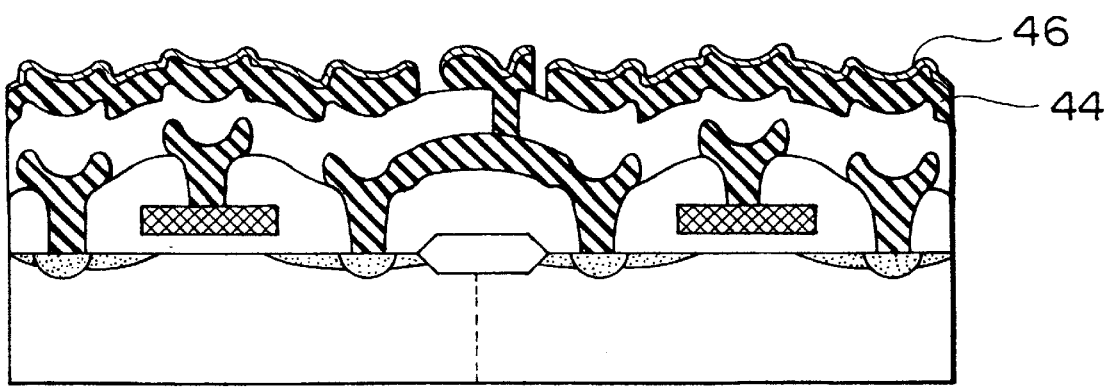
FIG. 4 is a cross-sectional view showing that a second metal wiring layer has been patterned during the manufacturing process in the first embodiment.

As shown in FIG. 4, by using the spattering method, Al—Si is deposited to a thickness of approximately 3000 to 8000 Å and TiN which is a material of a low reflectivity film 46 is deposited to a thickness of approximately 200 to 1000 Å. A second metal wiring layer 44 is thus formed and patterned. The layer 44 also serves as a light shielding portion.

Figure 5:
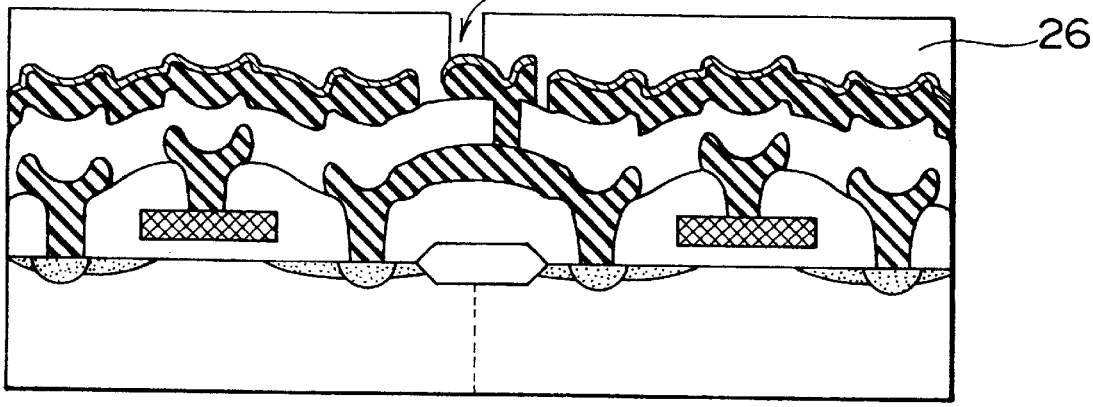
FIG. 5 is a cross-sectional view showing that a second via hole has been formed in the third interlayer insulating film during manufacturing process in the first embodiment.

As shown in FIG. 5, p-TEOS, for example, is deposited to a thickness of approximately 1.0 to 2.0 μm to thereby form a third interlayer insulating layer 26. The third interlayer insulating layer 26 is polished by the CMP (Chemical Mechanical Polishing) method by approximately 0.5 to 1.0 μm. Further, either p-TEOS or plasma silicon nitride p-SiN is deposited to a thickness of approximately 0.2 to 0.5 μm. A second via hole 30 is then formed.

Figure 6:
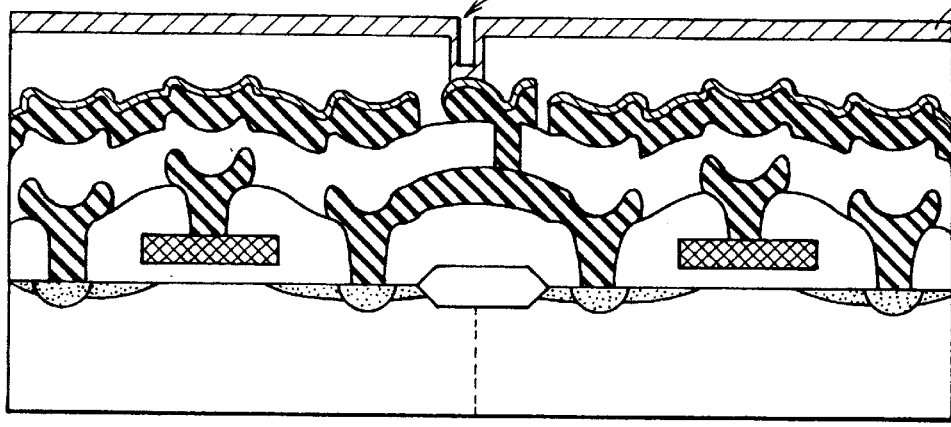
FIG. 6 is a cross-sectional view showing that a third metal wiring layer has been deposited during the manufacturing process in the first embodiment.

As shown in FIG. 6, Ti adhesive to the second interlayer insulating film 26 is deposited to a thickness of approximately 200 to 500 Å and TiN having sufficient conductivity and erosion resistance is deposited to a thickness of approximately 1000 to 3000 Å by the spattering method, respectively.

Figure 7:
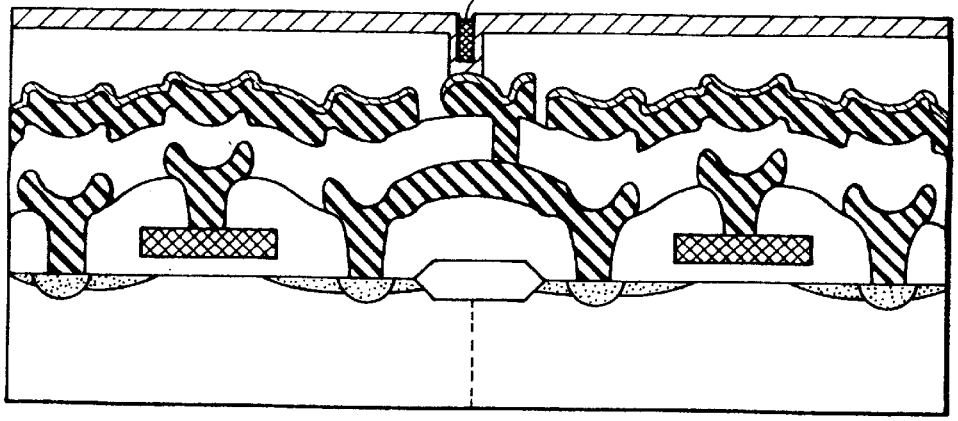
FIG. 7 is a cross-sectional view showing that the second via hole has been filled with a metal during manufacturing process in the first embodiment.

As shown in FIG. 7, tungsten W is deposited to a thickness of approximately 5000 to 15000 by the CVD method and is etched back by a deposited film thickness. Thus, tungsten W serving as a filling metal is only left within the second via hole 30 while that on the remaining portion is completely removed. The reason TiN/Ti is deposited before the CVD of W is conducted is that W is deposited only on the metal portion.

Furthermore, TiN/Ti is patterned. As a result, a semiconductor device according to the present first invention is obtained as shown in FIG. 1.

According to the present first invention, if W is not buried in the second via hole 30, as TiN/Ti is deposited to a thickness of 1500 Å/300 Å, the thickness of the via hole 30 is approximately 1000 Å/200 Å, about 0.3% of light is transmitted through the hole 30. However, by burying W into the via hole 30, light transmission becomes almost 0%.

In the meantime, suppose that multiple reflection of the light, which has been transmitted into the space 32 of the third metal wiring layer 40, occurs between the second metal wiring layer 44 and the third metal wiring layer 40 and that the reflectivity of Al—Si is set at 0.90, that of Ti below the third wiring layer 40 at 0.90 and that of TiN on the top surface of the second metal wiring layer 44 at 0.10. If TiN is not provided on the top surface of the second metal wiring layer 44, light intensity after light reflection has occurred 6 times is the 6th power of 0.90, that is, about 53%. According to the present first invention, by contrast, the top surface of the second metal wiring layer 44 is formed of TiN and light intensity after conducting light reflection 6 times is the product of the third power of 0.9 and the third power of 0.1, that is, 0.07%. The present first invention, therefore, can almost completely shield multiple-reflection light.

Furthermore, the present first invention has an additional advantage. That is, if an insulating film made of an arbitrary material is deposited on the third metal wiring layer 40 by mean of vaporization and so on, the insulating film is certain to be deposited on the via hole according to the present first invention. This is because the via hole 30 is buried. Thus, the insulating film can be made flat and the performance of the device is improved.

In this embodiment, the uppermost third metal wiring layer 40 is formed of TiN/Ti. However, it is noted that the structure and material of the uppermost metal wiring layer should not be limited to the above-described structure and material. For example, one layer film of Ti, TiN or TiW, or two layer film of Ti and TiN or TiW formed on Ti may be used. It is also possible to deposit a metal having higher conductivity such as Al, Al based alloy like Al—Si, Al—Cu on the TiN/Ti etc. and to thereby form an uppermost metal wiring layer. In that case, conductivity of the uppermost wiring layer can be further increased.

In this embodiment, the via hole is filled with W. Due to this, the later etchback becomes easier and metal is filled only within the via hole. It is noted that filling metal should not be limited to W and the other metal such as Mo, Al, Cu may be used.

Also in the conventional semiconductor device having multiple wiring layers, a via hole of wiring layer other than the uppermost wiring layer is filled by metal so as to ensure firm connection between wiring layers and to flatten an insulation film formed over the via hole. However, the uppermost via hole in the uppermost wiring layer was not filled by metal so as to reduce manufacturing cost, because no wiring layer is formed over the uppermost via hole. In the present first invention, the uppermost via hole is filled by the metal, because it is most effective to prevent light from entering into the semiconductor device.

Furthermore, in this embodiment, the surface of the second metal wiring layer provided below the uppermost metal wiring layer is covered with TiN. Due to this, surface reflectivity can be reduced without lowering conductivity of the second metal wiring layer. It is again noted that the structure and material of the second metal wiring layer should not be limited to the above-described structure and material. It is possible to replace Al—Si or TiN with the other material, for example, or the second metal wiring layer itself may be formed by a low reflectivity substance.

The present second invention will next be described with reference to the second embodiment.

In this embodiment, a minimum wiring width L is 1.4 $\mu$m and a minimum wiring spacing S is 1.0 $\mu$m. Use of reticules is needed for patterning. To form reticules, a minimum spot size G exists. Here, G is 0.1 $\mu$m.

Figure 8:
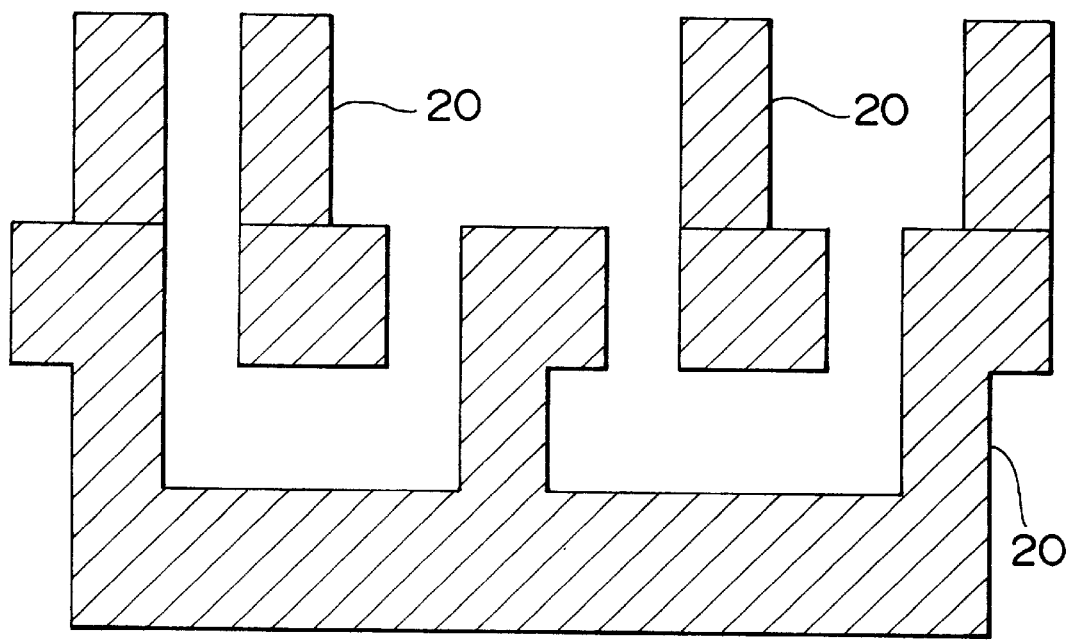
FIG. 8 illustrates the second embodiment according to the present second invention and is a top face view showing a normal circuit pattern before dummy wirings are inserted.

FIG. 8 shows that normal wiring 21 is formed between diffused layer regions by the conventional technique.

Figure 9:
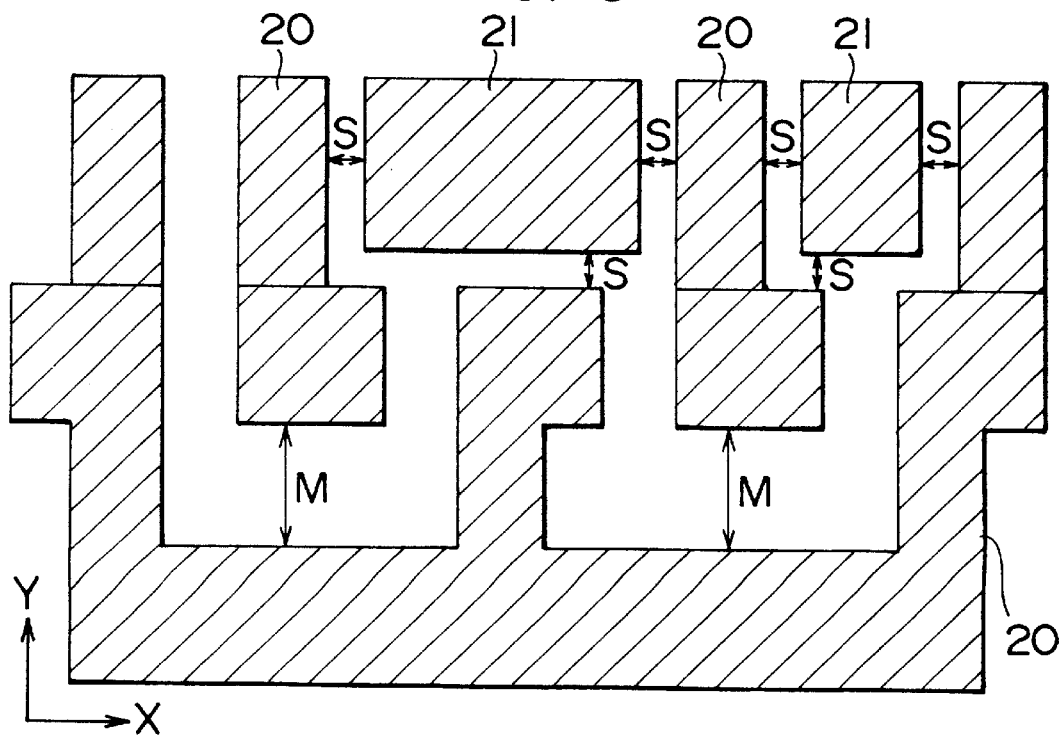
FIG. 9 is a top face view showing that dummy wirings are inserted into the circuit pattern of FIG. 8.

FIG. 9 shows that dummy wiring 21 is provided between the normal wiring 20. To form dummy wiring 21, a reverse pattern of the normal wiring 20 (non-wiring part pattern) shown in FIG. 8 is formed, reduced in size to $$S+(L/2)=1.0+(1.4/2)=1.7 \mu m$$

and expanded to $$L/2=1.4/2=0.7 \mu m.$$

Thus, the dummy wiring 21 distanced from the normal wiring 20 by the minimum wiring spacing S can be generated.

It is noted that the reason the reverse pattern in the wiring region is reduced not to S but to S+(L/2) and expanded to L/2 is to prevent portions against the minimum wiring width L rule from occurring if it is reduced simply to S. If a minimum wiring spacing is, for example, 3.0 $\mu$m, the reverse pattern of a width of 3 $\mu$m is reduced to $$3.0-(2\times 1.0)=1.0 \mu m$$

which is against the minimum wiring width (1.4 $\mu$m) rule. In case of S+(L/2), the reverse pattern is reduced to $$3.0-(2\times 1.7)=-0.4 \mu m.$$

As a result, the pattern can be eliminated in the normal CAD design method and is not against the rule.

By generating dummy wiring 21 and composing them with the normal wiring 20, a wiring pattern after the dummy wiring are inserted, as shown in FIG. 9 is obtained. The wiring spacing M after the dummy wiring have been inserted is $$2\times [S+(L/2)] = 2\times [1.0+(1.4/2)]$$
$$= \text{less than } 3.4 \mu m.$$

The pattern shown in FIG. 9 can be obtained by the conventional technique. The method of inserting dummy wiring should not be, however, limited to the above-described method.

Figure 10:
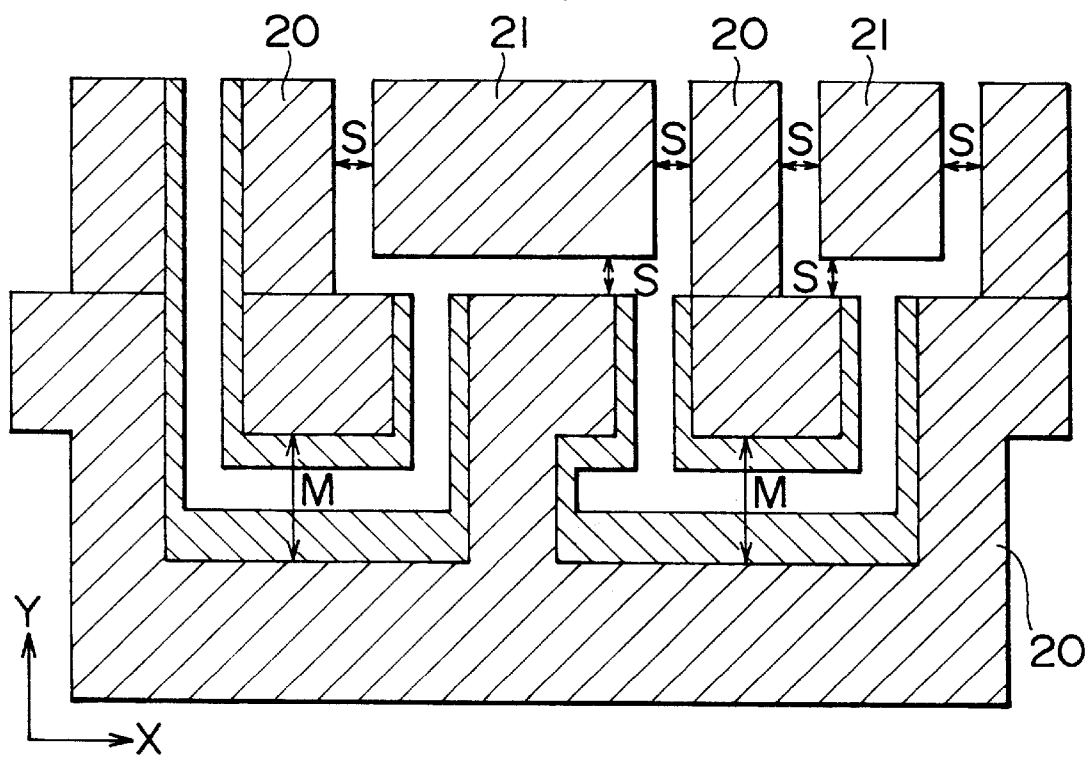
FIG. 10 is a top face view of one example of circuit pattern wherein wiring patterns facing the wiring spacing, where dummy pattern cannot be inserted, are widened.

FIG. 10 shows the second embodiment wherein wiring spacing of the dummy wiring inserted pattern as shown FIG. 9 is reduced to the minimum wiring spacing by the present second invention.

In this embodiment, wiring spacing more than the minimum wiring spacing S=1.0 $\mu$m and less than 2S+L=3.4 $\mu$m, where no dummy pattern can be inserted, is reduced by uniformly widening wiring patterns facing the wiring spacing. By this structure, later formed interlayer insulating film can be flattened and light shielding area can be increased so that light entering into lower layer can be reduced.

In the second embodiment, it is desirable that the wiring spacing is narrowed to the minimum wiring spacing.

Method to realize the second embodiment is not limited to any specific method. For example, conventional CAD method can realize the second embodiment.

According to the present second invention, even if the wiring spacing is too small for a dummy wiring to be inserted, the wiring widths on both sides can be widened and the wiring spacing is reduced by using a simple method of an automatic operation on the CAD. Therefore, the coverage on the upper wiring can be improved and wiring defects can be reduced, whereby highly reliable wiring can be formed by the simplified manufacturing method.

In addition, even if there is a problem of the wiring coupling capacity, an optimum capacity can be obtained by selecting a maximum final wiring spacing F appropriately.

The third embodiment according to the present third invention will be described in detail hereinafter.

Figure 11:
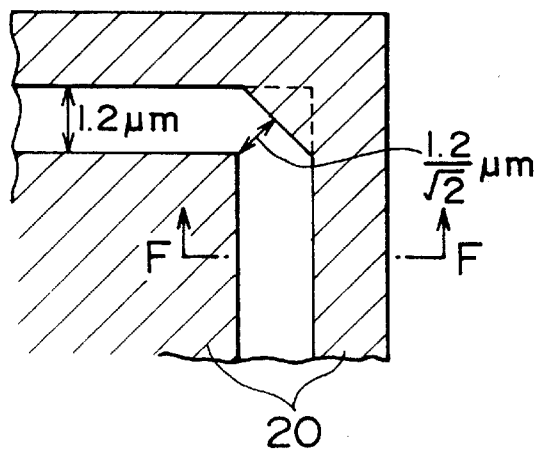
FIG. 11 is a plan view showing an example of a wiring pattern in the third embodiment according to the present third invention.
Figure 27:
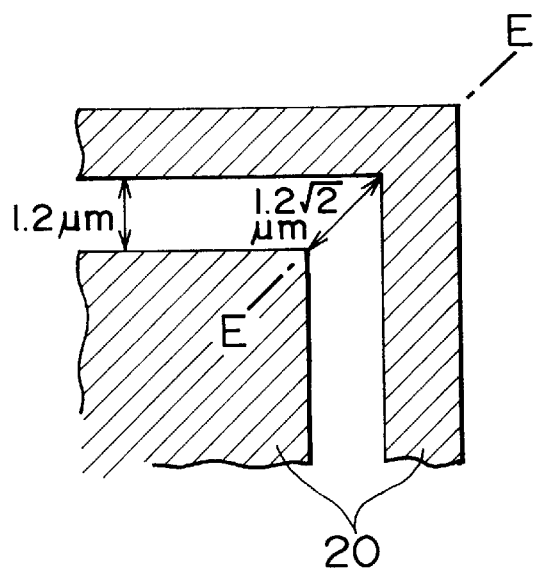
FIG. 27 is a plan view showing a simple bent pattern according to the prior art.

In this embodiment, a 45° isosceles triangle is provided as shown in FIG. 11 in the corner of the outer bent wiring as shown in FIG. 27. By so doing, the wiring spacing at the bent portion can be equal to or smaller than that at the straight portion.

Figure 12:
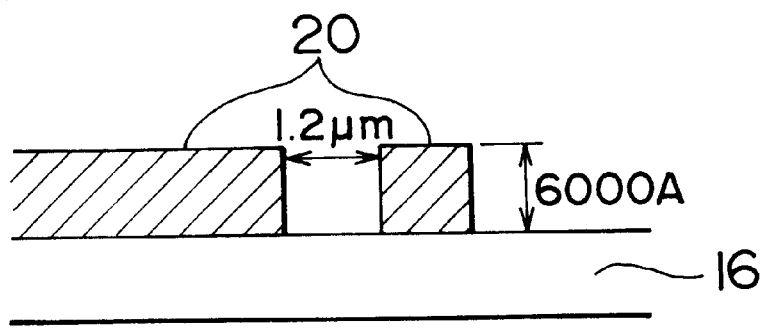
FIG. 12 is a cross-sectional view taken along lines F—F of FIG. 11.
Figure 13:
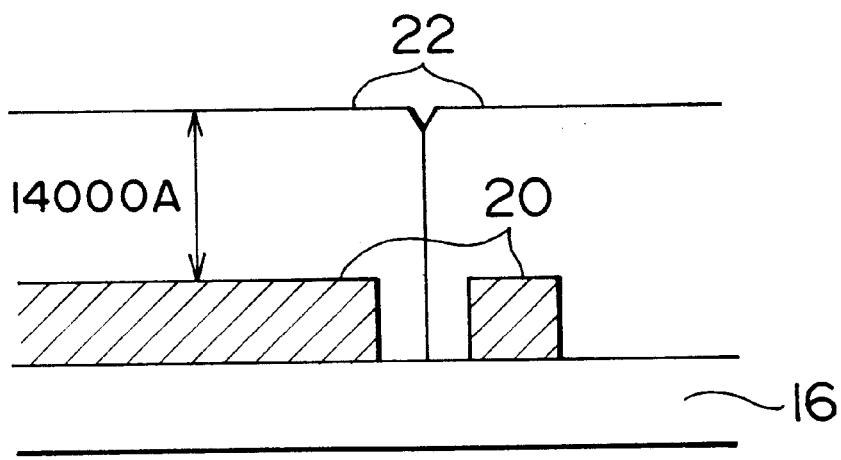
FIG. 13 is a cross-sectional view showing that the insulating film has been just formed on the metal wiring layer of FIG. 12.
Figure 14:
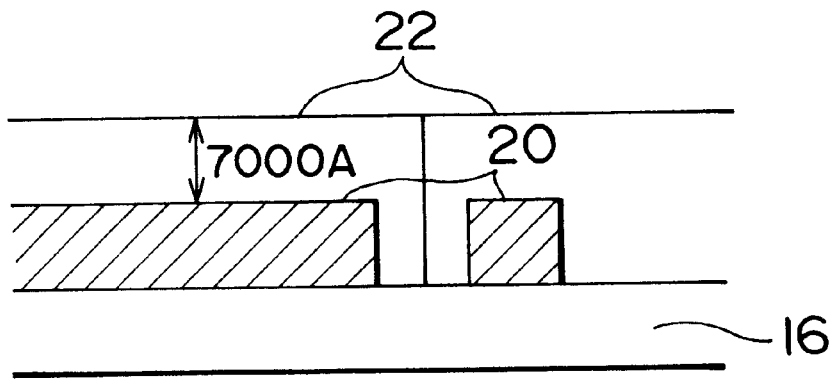
FIG. 14 is a cross-sectional view showing the state after the insulating film of FIG. 13 has been polished to a predetermined thickness.
Figure 28:
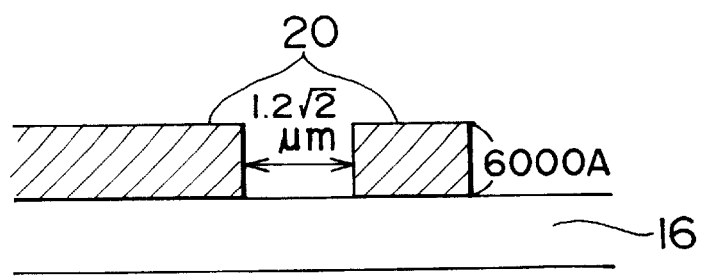
FIG. 28 is a cross-sectional view taken along lines E—E of FIG. 27.
Figure 29:
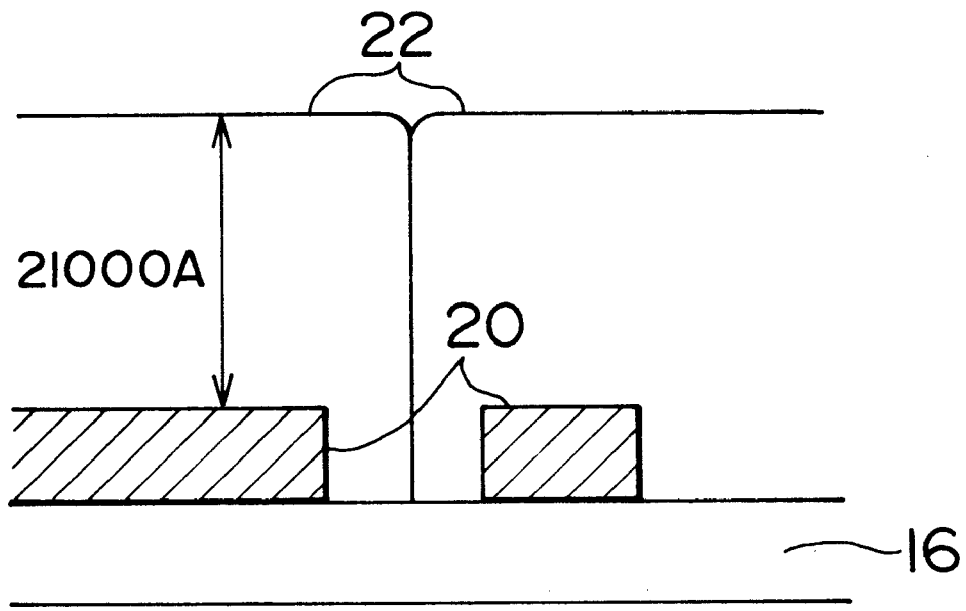
FIG. 29 is a cross-sectional view showing the state right after the insulating film has been formed on the metal wiring of FIG. 28.
Figure 30:
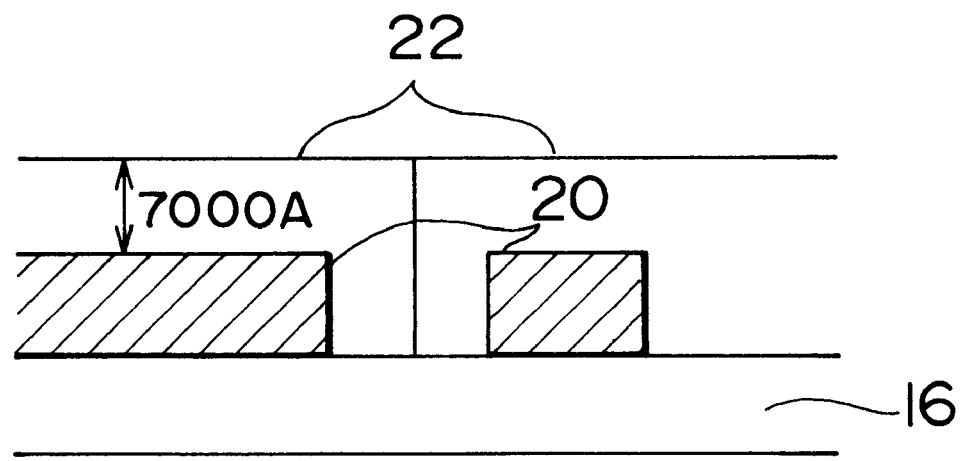
FIG. 30 is a cross-sectional view showing the state right after the insulating film of FIG. 29 has been polished to a predetermined thickness.

The film formation steps are illustrated by FIGS. 12 to 14 in contrast to prior art FIGS. 28 to 30. As in the case of the prior art, the formation of a flat insulating film having a minimum thickness of 7000 Å on the upper wiring layer having a thickness of 6000 Å in the wiring pattern shown in FIG. 11 is explained.

An interlayer insulating film 16 is formed on a silicon substrate (not shown) and a metal wiring 20 having a thickness of 6000 Å is formed on the interlayer insulating film 16 by using the pattern of FIG. 11 and by the usual method in advance. FIG. 12 shows the cross-sectional view taken along a line F—F of FIG. 11 which is the widest wiring spacing in the pattern of FIG. 11. In this state, using a P-TEOS CVD device, an insulating film 22 for isolating the upper wiring is formed. By the P-TEOS CVD device, the film formation ratio of the upper part of the wiring to the sidewall is 5:2. To bury the wiring spacing of 1.2 $\mu$m shown in FIG. 12, a film thickness of approximately 14000 Å is necessary as shown in FIG. 13. A maximum thickness of 9000 Å is obtained by the P-TEOS CVD device per once operation. A film with a thickness of 7000 Å is formed twice as shown in FIG. 13. Thereafter, the film is polished to a thickness of 7000 Å by the CMP method, thereby obtaining a desired flat insulating film shown in FIG. 14.

As can be seen from the above description, if using the wiring pattern of FIG. 11, a flat insulating film 22 shown in FIG. 14 can be formed by depositing an insulating film to a thickness of 7000 Å twice (14000 Å in total) and by polishing the film to a thickness of 7000 Å by the CMP method.

According to the present third invention, the thickness of the insulating film prior to polishing can be reduced to the minimum for obtaining a desired flat insulating film. Due to this, the through put of the film formation device and the polishing device can be improved and the manufacturing cost can be reduced.

In addition, if the film is flattened by the CMP method, the polishing amount can be lessened to thereby improve flatness. Namely, if the CMP method is used for polishing, it is known by experience that if a polished amount is large, the surface uniformity after polishing is lowered. However, in this embodiment, the polishing amount can be reduced from 14000 Å to 7000 Å. As a result, not only through put but also surface uniformity are improved. It is noted that the polishing method should not be limited to the CMP method.

Figure 15:
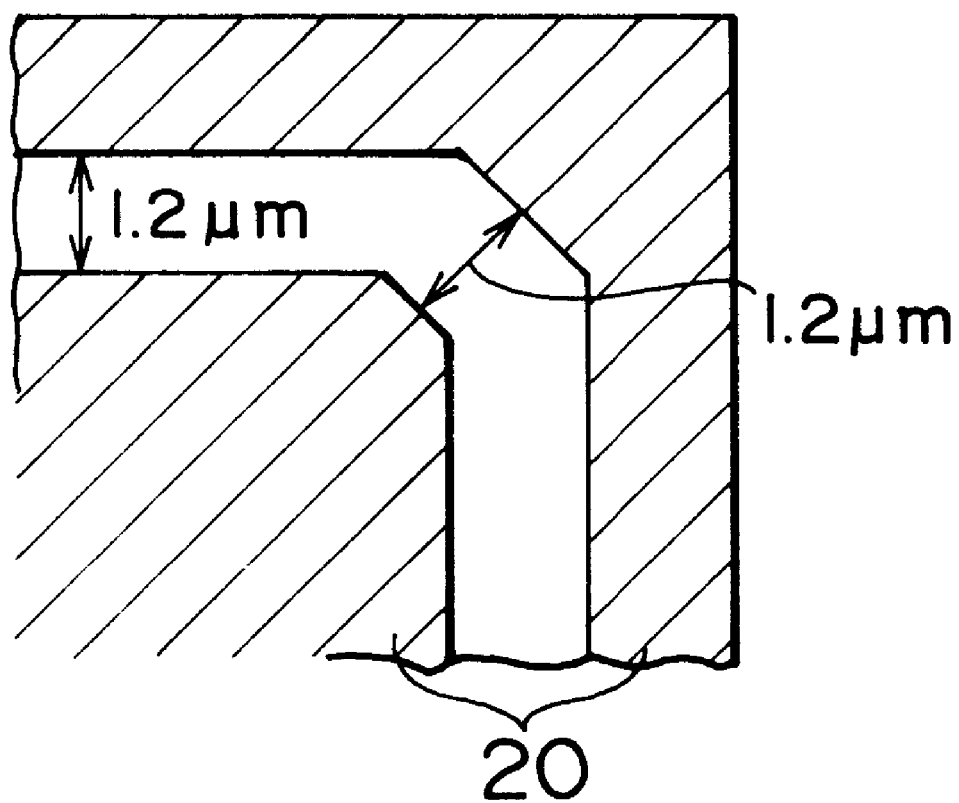
FIG. 15 is a plan view showing an example of the wiring pattern in the fourth embodiment according to the present third invention.

In this embodiment, since an isosceles triangle is added to the corner of the outer bent wiring, the wiring spacing at the bent portion is 1/√2 of that at the straight portion. Nevertheless, the wiring pattern is easily designed. It is also noted that the method of making the wiring spacing at the bent portion narrower than that of the simple bent wiring pattern as shown in FIG. 27 should not be limited to the above-described one. It is possible to adopt the method described in the fourth embodiment as shown in FIG. 15. That is, in the fifth embodiment, an isosceles triangle is added to the corner of the outer bent wiring and the corner of the inner bent wiring is cut. In this case, the wiring spacing at the bent portion can be almost the same as that at the straight portion.

The fifth embodiment according to the present fourth invention will be described in detail.

Figure 16:
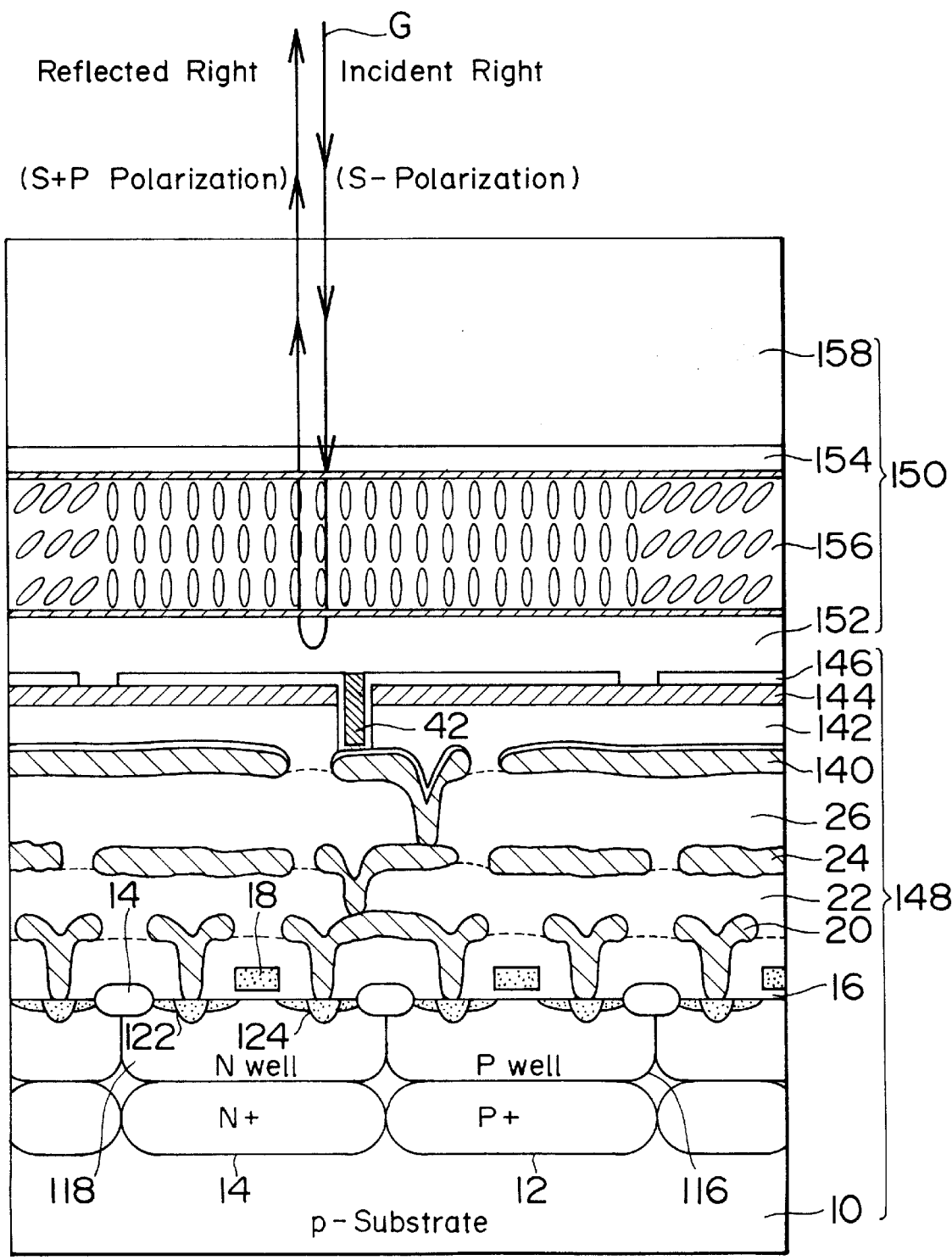
FIG. 16 is a partial cross-sectional view showing important parts of the semiconductor device for driving a reflection type liquid crystal in the fifth embodiment according to the present fourth invention.
Figure 17:
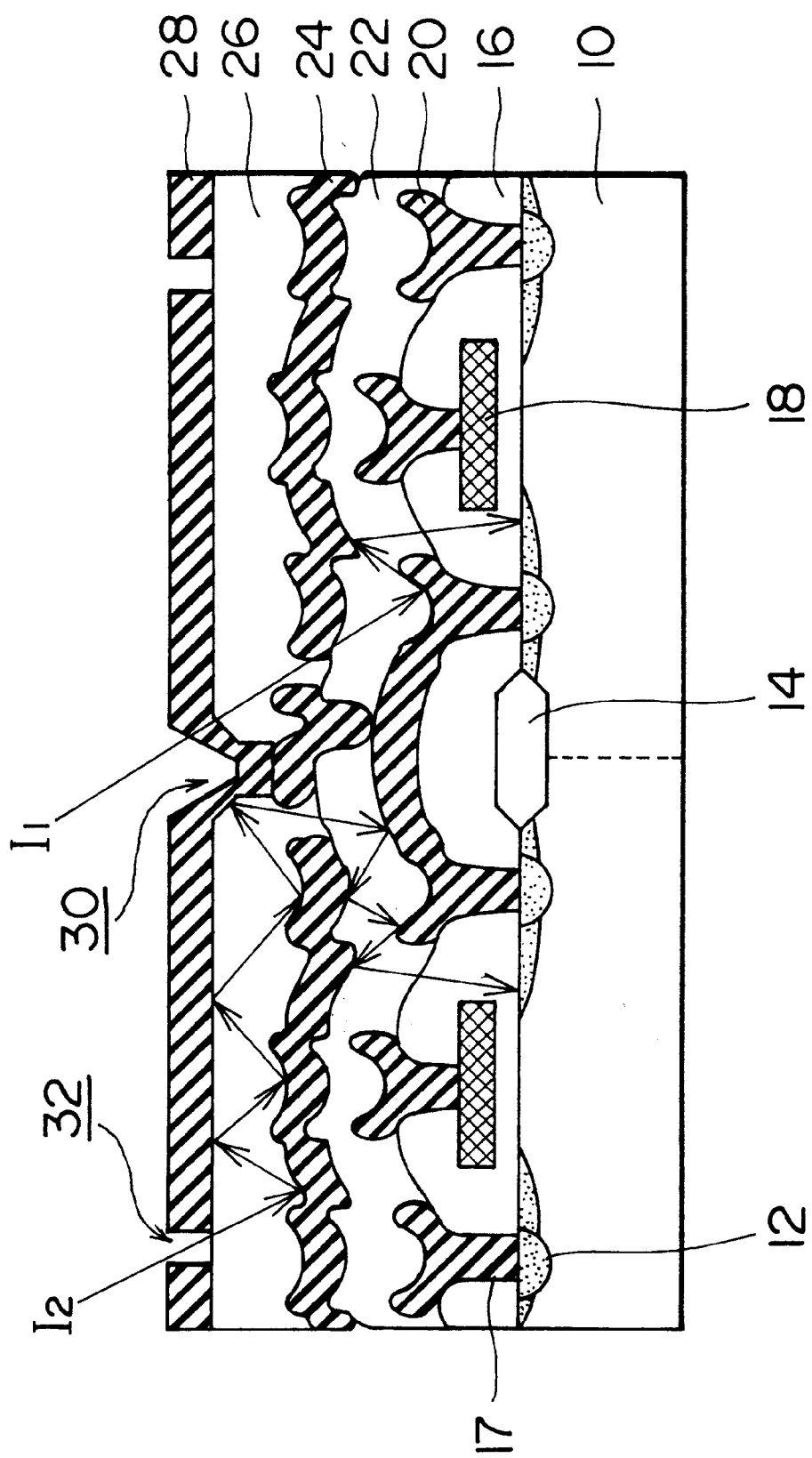
FIG. 17 is a cross-sectional view showing the structure of the conventional semiconductor chip having metals provided not only in wiring regions but also in regions other than the wiring regions.
Figure 18:
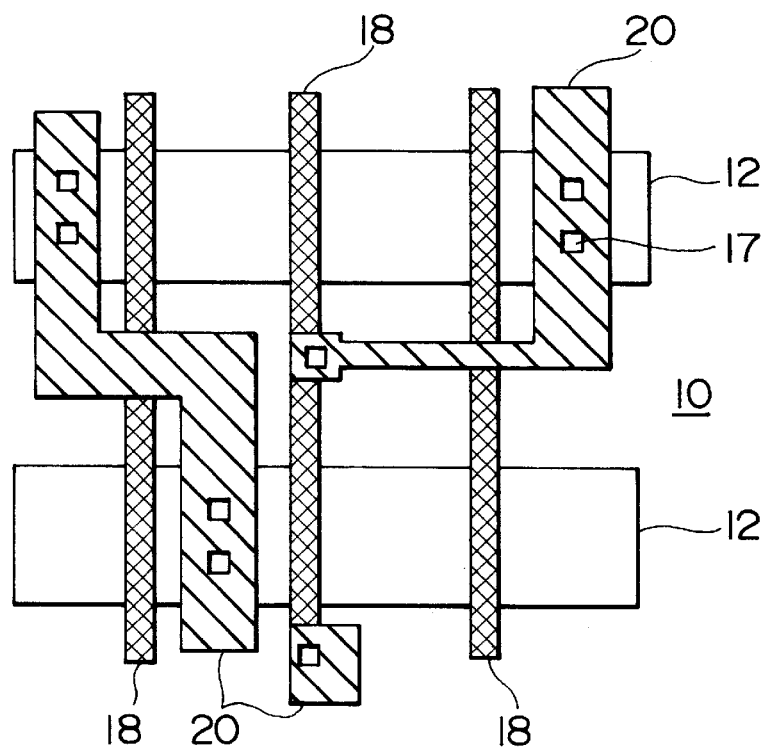
FIG. 18 is a top face view showing an example of multiple wiring layers in the conventional MOS transistor.
Figure 19:
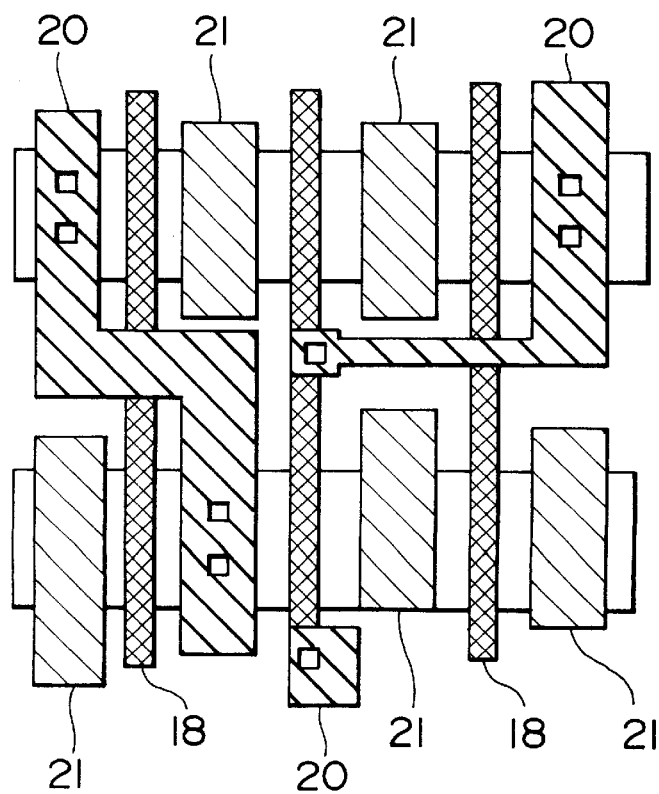
FIG. 19 is a top face view showing that dummy wirings have been added to the wiring pattern of FIG. 18.
Figure 20:
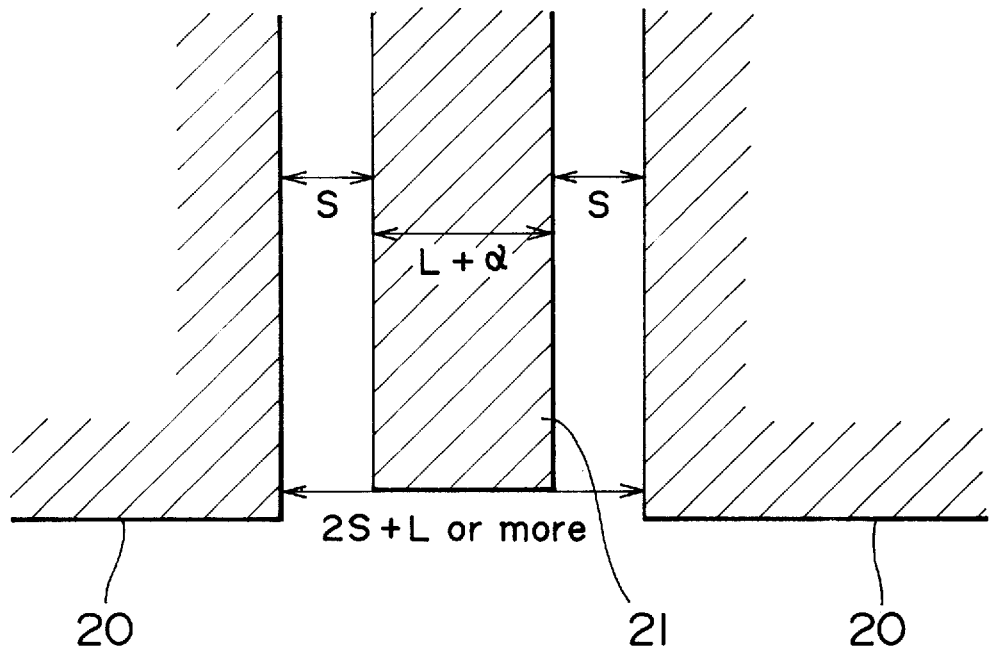
FIG. 20 is a top face view showing that the dummy wirings have been inserted where sufficient wiring spacing is kept according to the conventional method.
Figure 21:
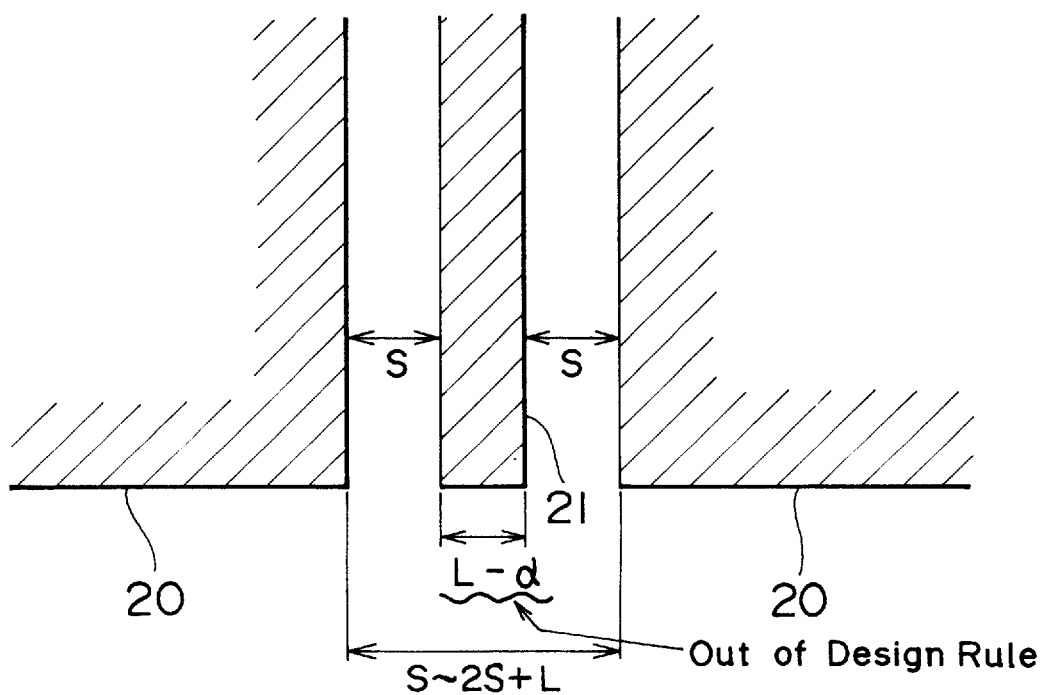
FIG. 21 is a top face view showing that the dummy wiring has been inserted while wiring spacing is insufficient according to the conventional method.
Figure 22:
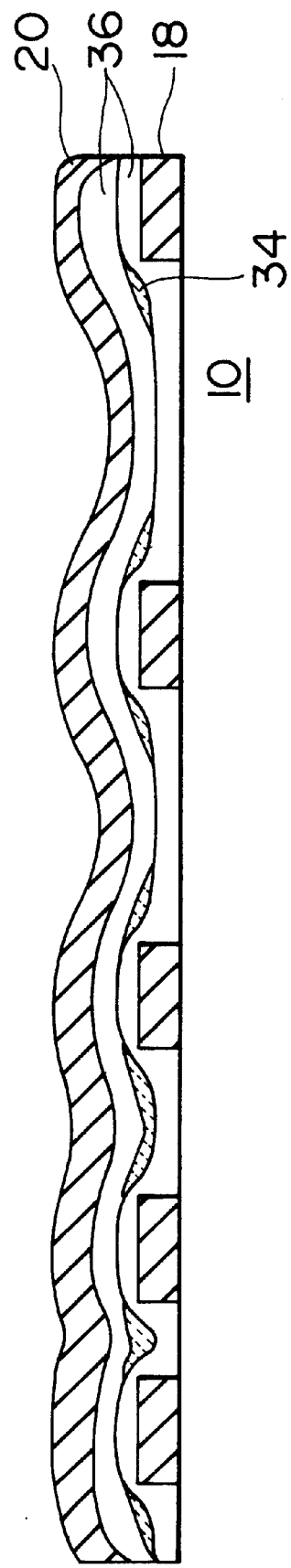
FIG. 22 is a cross-sectional view of the semiconductor chip for describing problems of prior art.
Figure 23:
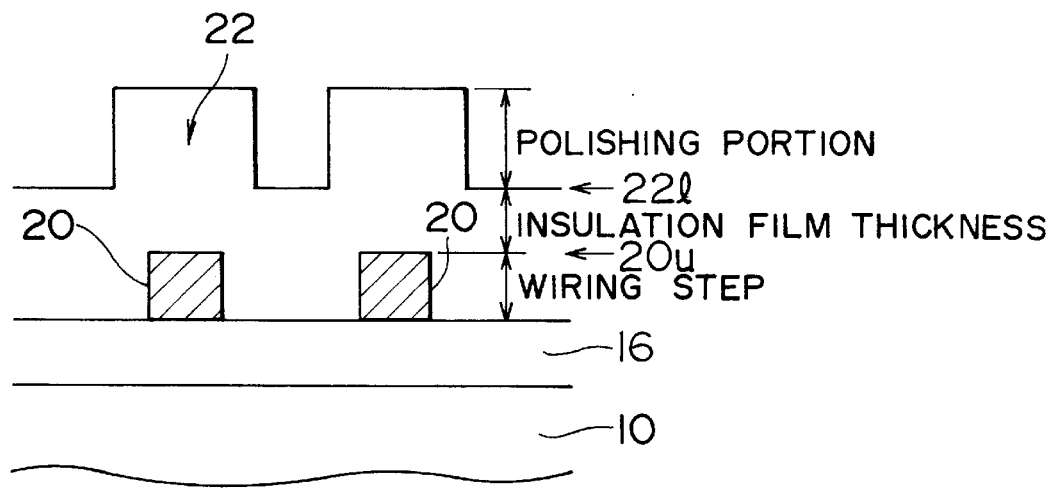
FIG. 23 is a cross-sectional view showing the state right after the insulating film has been formed on the metal wiring according to the prior art.
Figure 24:
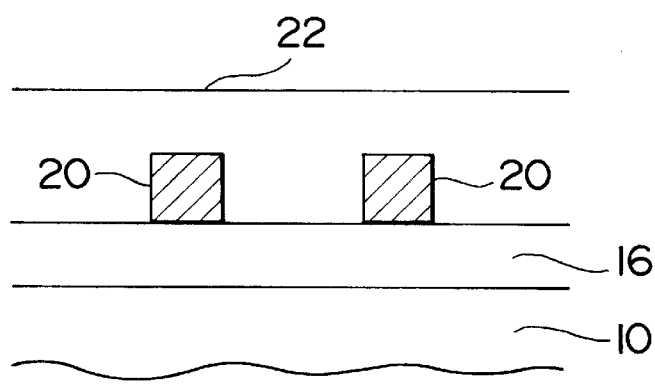
FIG. 24 is a cross-sectional view showing the state after the insulating film of FIG. 23 has been polished.
Figure 25:
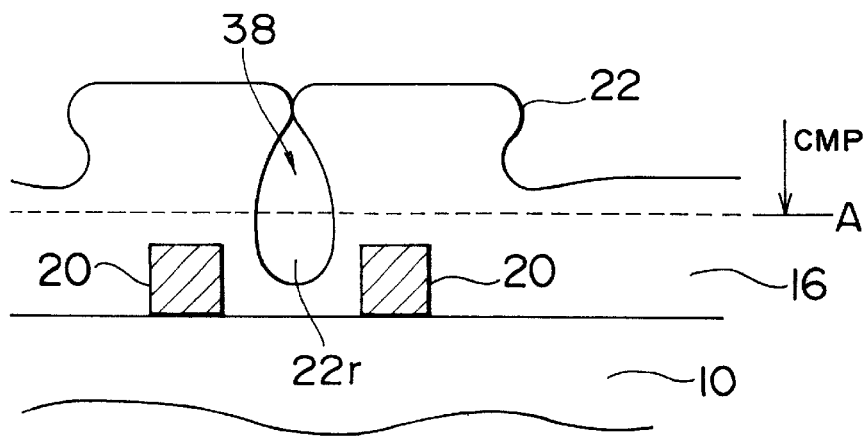
FIG. 25 is a cross-sectional view showing that an insulating film has been formed on the wiring layer by using a film formation method with bad coverage according to the prior art.
Figure 26:
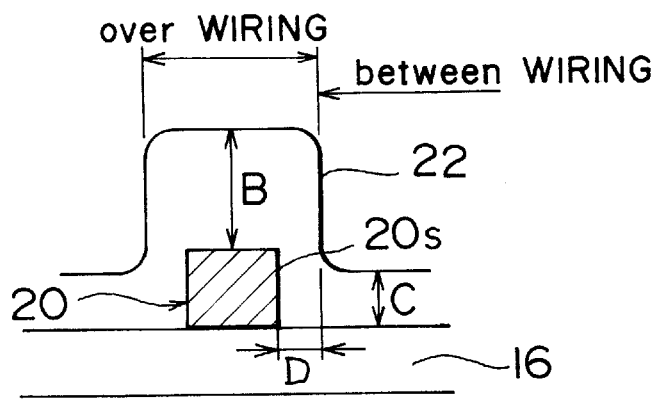
FIG. 26 is a diagram for describing the film formation ratio of the prior art.

FIG. 16 is a cross-sectional view showing the structure of a semiconductor device for driving a reflection type liquid crystal in this embodiment.

In this embodiment, a P+ buried region 112 and an N+ buried region 114 are formed on, for example, a P-type silicon substrate by, for example, the burying epitaxial growth method. A p well 116 and an N well 118 are formed in the P+ buried region 112 and the N+ buried region 114, respectively. The P well 116 and the N well 118 are isolated from each other by, for example, LOCOS 14. A source region 122, a drain region 124 and a gate 18 are formed on each of the wells 116 and 118, thus forming a high voltage transistor in matrix.

A first metal wiring layer 20 made of, for example, aluminum (Al) based material is formed on a first interlayer insulating film 16 covering the transistor. The bent portion of the first metal wiring layer 20 may, or may not be given an isosceles triangle according to the present third invention.

A second metal wiring layer 24 made of, for example, aluminum (Al) based material is formed on a second interlayer insulating film 22 covering the first metal wiring layer 20. A third metal wiring layer 140 made of, for example, aluminum (Al) based material is formed on a third interlayer insulating film 26 covering the second metal wiring layer 24. The top surface of the third metal wiring layer 140 is covered by TiN and has low reflectivity according to the present first invention.

The top surface of a fourth interlayer insulating film (or uppermost interlayer insulating film) 142 covering the third metal wiring layer 140 is polished and flattened by the CMP method and p-SiN layer 144 is formed at the top of the fourth interlayer insulating film 142.

A fourth metal wiring layer (or uppermost metal wiring layer) 146 made of, for example, TiN/Ti is formed on the fourth interlayer insulating film 142 by the present first invention. A via hole 30 for communicating the fourth metal wiring layer 146 with the third metal wiring layer 140 is filled with W as the filling metal 42 according to the present first invention.

The entirety or part of the respective metal wiring layers are provided with dummy wirings, if necessary, and the wiring spacings are reduced according to the present second invention.

The fourth metal wiring layer 146 serves as a pixel electrode layer for a liquid crystal arranged on the chip.

The semiconductor substrate 10 through the fourth metal wiring layer 146 thus constitute a liquid crystal driving chip 148. A liquid crystal unit 150 is disposed on the chip 148.

The liquid crystal unit 150 consists of a dielectric reflection film 152 having a mirror-like flat reflection surface for reflecting incident light, a transparent electrode 154 provided above the reflection film 152 through a predetermined space and a liquid crystal 156 put between the dielectric reflection film 152 and the transparent electrode 154 and a liquid crystal protection glass 158 provided on the transparent electrode 154.

In the semiconductor device for driving the liquid crystal display of this embodiment, when incident light of S polarization passing through the surface of the glass 158 in the direction of arrow G reflects on the mirror-like flattened surface of the dielectric reflection film 152 and returns in the arrow direction, the intensity of the reflection light of S+P polarization can be controlled by changing the configuration of the liquid crystal. The liquid crystal configuration can be changed by changing driving states each of matrix transistors formed on the chip 148 for every pixel.

Structures and functions of components other than the chip 148 employing the present first to third inventions are the same as those of the well-known Si chip based liquid crystal. Detailed description thereto will not be therefore given herein.

In this embodiment, the first through third inventions are applied to a semiconductor device for driving the reflection type liquid crystal. However, application of the first through third inventions should not be limited to the semiconductor device for driving the reflection type liquid crystal.

It should be apparent to those skilled in the art that the above-described embodiments are merely illustrative which represent the application of the principles of the present invention. Numerous and varied other arrangements can be readily devised by those skilled in the art without departing from the spirit and the scope of the invention.

What is claimed is:

1. A semiconductor device for driving reflection type liquid crystal comprising:

at least one wiring layer, except an uppermost wiring layer, wherein a dummy wiring is provided at a wiring spacing whose interval is greater than 2S+L, wherein S is a minimum wiring spacing and L is a minimum wiring width, the uppermost wiring layer having at least a bottom surface thereof formed of Ti, TiN or TiW; and an uppermost via hole that connects the uppermost wiring layer and a lower wiring layer, wherein the uppermost via hole is filled with the uppermost wiring layer and another metal thereon and the another metal is filled to substantially the same height as the uppermost wiring layer; and a reflection type liquid crystal unit arranged on the semiconductor chip and driven by the semiconductor chip;

wherein said uppermost wiring layer comprises at least one of TiN and TiW formed on the bottom surface which is made of Ti.

2. A semiconductor device according to claim 1, wherein said uppermost via hole is filled with at least one of tungsten W, molybdenum Mo, aluminum Al and copper Cu.

3. A semiconductor device according to claim 1, wherein said uppermost wiring layer further comprises the another metal deposited thereon.

4. A semiconductor device according to claim 3, wherein said another metal deposited on the uppermost wiring layer is an Al based alloy.

* * * * *